United States Patent
Weaver et al.

(10) Patent No.: US 7,352,001 B1
(45) Date of Patent: Apr. 1, 2008

(54) METHOD OF EDITING A SEMICONDUCTOR DIE

(75) Inventors: Kevin Weaver, San Jose, CA (US); Henry Acedo, Morgan Hill, CA (US); Lakshmi Durbha, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 32 days.

(21) Appl. No.: 11/451,918

(22) Filed: Jun. 12, 2006

Related U.S. Application Data

(62) Division of application No. 10/625,010, filed on Jul. 22, 2003, now Pat. No. 7,087,927.

(51) Int. Cl.
*H01L 23/58* (2006.01)

(52) U.S. Cl. ............... 257/48; 257/758; 257/E21.526; 257/E23.179; 438/14

(58) Field of Classification Search .................. 257/48, 257/E21.526
See application file for complete search history.

(56) References Cited

U.S. PATENT DOCUMENTS

| | | | | |
|---|---|---|---|---|
| 5,419,807 A | 5/1995 | Akram et al. | ............ | 156/647.1 |
| 5,789,303 A | 8/1998 | Leung et al. | ................ | 438/381 |
| 6,022,750 A | 2/2000 | Akram et al. | ................. | 438/18 |
| 6,100,573 A | 8/2000 | Lu et al. | ...................... | 257/508 |
| 6,147,857 A | 11/2000 | Worley et al. | ............ | 361/301.2 |
| 6,211,527 B1 | 4/2001 | Chandler | .................. | 250/492.2 |
| 6,346,302 B2 | 2/2002 | Kishimoto et al. | .......... | 427/569 |
| 6,426,556 B1 | 7/2002 | Lin | ............................ | 257/738 |
| 6,462,427 B2 | 10/2002 | Sakiyama et al. | ........... | 257/786 |
| 6,492,261 B2 | 12/2002 | Gavish et al. | .............. | 438/637 |
| 6,706,584 B2 | 3/2004 | List et al. | .................... | 438/239 |
| 6,763,578 B2 | 7/2004 | Farnworth et al. | ............ | 29/833 |
| 6,846,717 B2 | 1/2005 | Downey et al. | ............. | 438/400 |
| 6,911,832 B2 | 6/2005 | Kolachina et al. | ........... | 324/751 |
| 2003/0049882 A1 | 3/2003 | Yin et al. | .................... | 438/106 |

OTHER PUBLICATIONS

Caiwen Yuan, et al., "Application of Focused Ion Beam In Debug And Characterization Of 0.13um Copper Interconnect Technology", Proceedings From The 28th International Symposium For Testing And Failure Analysis, Nov. 3-7, 2002, Phoenix, Arizona, pp. 183-188.

*Primary Examiner*—Tu-Tu Ho
(74) *Attorney, Agent, or Firm*—Mark C. Pickering

(57) ABSTRACT

Resistance and capacitance are added to a prototype die to fix or identify performance issues with the integrated circuit formed in the die by forming a thin piece of silicon on the top surface of the die. For resistance, vias are formed to regions on the metal traces and to opposite ends of the piece of silicon using a FIB system. For capacitance, a dielectric is formed on the piece of silicon, and a layer of metal is formed on the dielectric. Vias are formed to regions on the metal traces, to the piece of silicon, and to the layer of metal using the FIB system.

19 Claims, 7 Drawing Sheets

METHOD OF EDITING A SEMICONDUCTOR DIE

This is a divisional application of application Ser. No. 10/625,010 filed on Jul. 22, 2003, now U.S. Pat. No. 7,087,927 issued on Aug. 8, 2006.

BRIEF DESCRIPTION OF THE DRAWINGS

FIG. 1A is a plan view of device 100, while FIGS. 1B-1G are cross-sectional views taken along line 1B-1B of FIG. 1A.

FIG. 2A is a plan view of die 100, while FIGS. 2B-2G are cross-sectional views taken along line 2B-2B of FIG. 2A.

DETAILED DESCRIPTION OF THE INVENTION

Figure 1A:
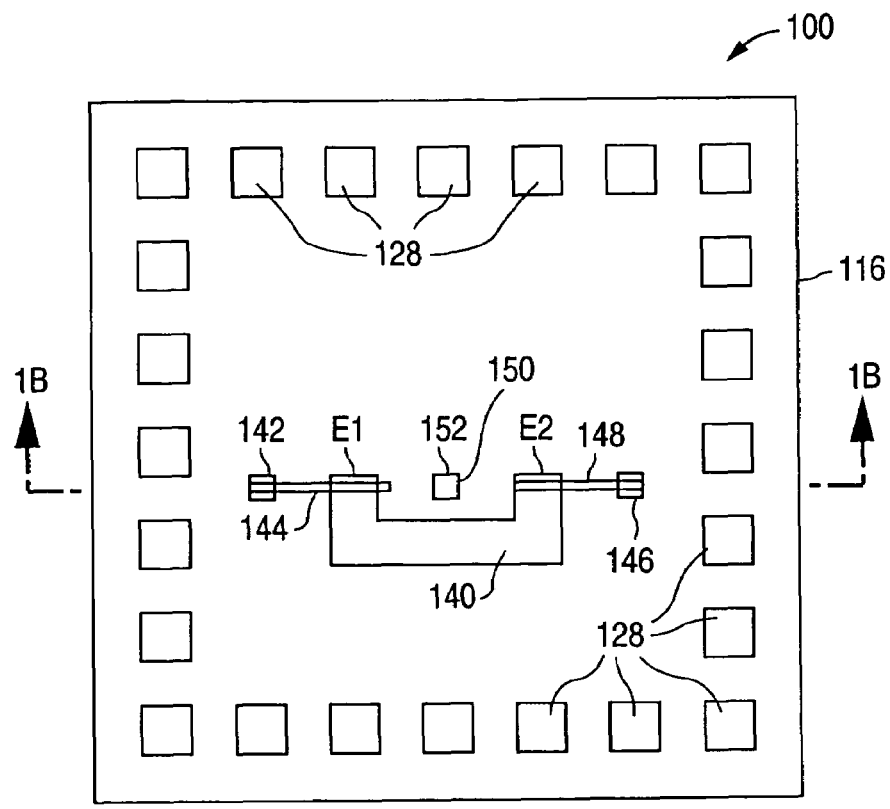
FIGS. 1A-1G are views illustrating an example of a method of editing a semiconductor die 100 in accordance with the present invention.

FIGS. 1A-1G show views that illustrate an example of a method of editing a semiconductor die 100 in accordance with the present invention. FIG. 1A shows a plan view of die 100, while FIGS. 1B-1G show cross-sectional views taken along line 1B-1B of FIG. 1A. Die 100 can be, for example, a prototype die that has been extracted from a semiconductor package after the integrated circuit on the die has been fabricated and tested. Non-packaged, fabricated die can also be used.

Figure 1B:
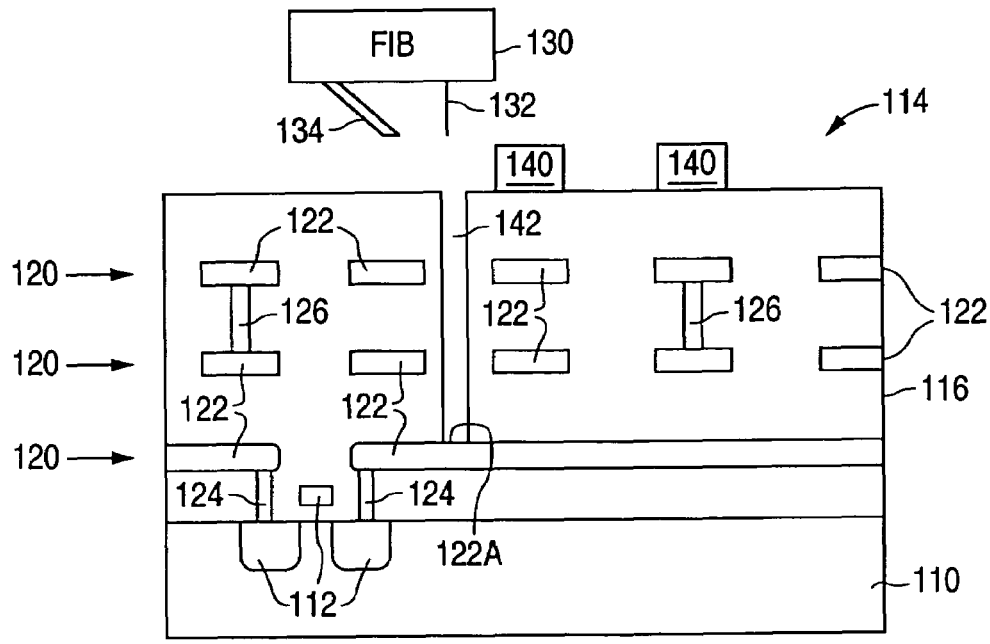

As shown in FIGS. 1A and 1B, semiconductor die 100 includes a semiconductor substrate 110, and a number of device conductive regions 112 that are formed in and over substrate 110. The device conductive regions 112 can include, for example, the source, drain, and gate regions of MOS transistors, the emitter, base, and collector regions of bipolar transistors, along with other regions.

Semiconductor die 100 also includes an interconnect structure 114 that is formed on substrate 110 to make electrical connections with the device conductive regions 112, and form the top surface of die 100. Interconnect structure 114, in turn, includes a dielectric structure 116 that contacts substrate 110, and a number of layers of metal 120 that are formed in and isolated by dielectric structure 116. Dielectric structure 116 can include a number of insulation layers, with the same or different materials, as well as an overlying passivation layer that forms a part of the top surface of die 100, while each metal layer 120 includes a number of metal traces 122.

Interconnect structure 114 also includes a number of contacts 124, a number of vias 126, and a number of pads 128 that are formed in dielectric structure 116. Contacts 124 electrically connect the device conductive regions 112 to the metal traces 122 that are formed from the first layer of metal 120. Vias 126 are formed in dielectric structure 116 to electrically connect vertically adjacent metal traces 122 and regions, while pads 128 are connected to vias 126 to form external points of electrical connection.

In addition, the method of editing semiconductor die 100 utilizes a focused ion beam (FIB) milling and deposition system 130. FIB systems and the operation of these systems to mill openings and deposit materials are well known in the art as illustrated by U.S. Pat. Nos. 6,492,261 and 6,211,527, which are hereby incorporated by reference.

System 130 includes a beam 132, such as a gallium (metal) ion beam, and gas injectors 134 that introduce one or more gases into a vacuum chamber. Beam 132 alone, or in the presence of gases that limit redeposition, mill an opening, while beam 132 in the presence of other gases deposits materials, such as metals and insulators, when the gases interact with beam 132. Beam 132 can have a scanning raster movement with a number of steps per line where the steps can have varying dwell times.

As further shown in FIG. 1A, the method begins by forming a conductive semiconductor region 140 on the top surface of interconnect structure 114 after die 100 has been fabricated. In the present example, semiconductor region 140 has a known resistance and opposite ends E1 and E2. Region 140 can represent, for example, a resistor.

Semiconductor region 140 can have any shape, and is shown with a square U-shape for purposes of illustration only (so that three openings can be seen in the same cut plane). The geometry of semiconductor region 140, along with the dopant concentration level (e.g., p−, n−, n, or n+) of region 140, can be adjusted to meet a range of customized resistance values. In the present invention, the resistances within the range of values are substantially greater than the resistance of a metallic material, such as aluminum.

For example, a line of metal approximately three millimeters (mm) long and one micron by one micron is required to achieve a 1 nS delay with conventional semiconductor metals, such as tungsten. In contrast, the present invention utilizes a non-metallic material, such as silicon, which has a resistance that is substantially higher than metal. In addition, a range of resistances, which are all much higher than the resistance of metal, can be obtained by varying the dopant concentration level and the geometry of semiconductor region 140.

Semiconductor region 140 can be formed, for example, by physically mounting a thin piece of doped single-crystal silicon approximately 1KÅ thick to the top surface of dielectric structure 116 with an adhesive after die 100 has been formed. In addition, it is expected that a layer of polysilicon (undoped or doped with a range of dopant concentrations) can also be formed on the top surface of dielectric structure 116 after die 100 has been formed in the same manner that other materials are deposited with FIB system 130, by utilizing a silicon source gas that deposits silicon when the gas interacts with the focused ion beam.

Once semiconductor region 140 has been formed on the top surface of interconnect structure 114, the method mills a first opening 142 through dielectric structure 116 to expose a first region 122A on a metal trace 122 using FIB system 130. First region 122A can be deeply embedded in the circuit architecture, such as on the metal-1 level. The processes of milling an opening with a FIB system to expose a metal trace, including the use of gases that interact with the focused ion beam to limit the re-deposition of milled materials, are well known in the art.

Figure 1C:
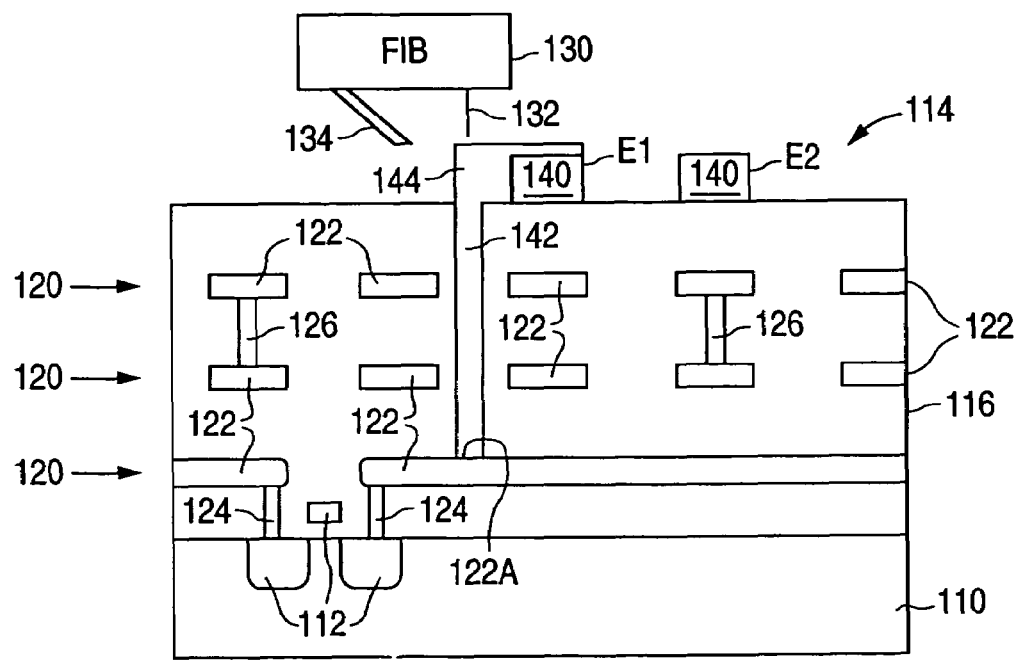

As shown in FIG. 1C, after first opening 142 has been formed, the method forms a first metal region 144 that fills up opening 142 using FIB system 130. In addition, once opening 142 has been filled, the method continues by extending first metal region 144 from opening 142 to end E1 of semiconductor region 140 using FIB system 130. As a result, metal region 144 makes an electrical connection between region 122A and end E1. The processes of forming metal regions with a FIB system utilizing a gas that deposits metal when the gas interacts with the focused ion beam are well known in the art.

Figure 1D:
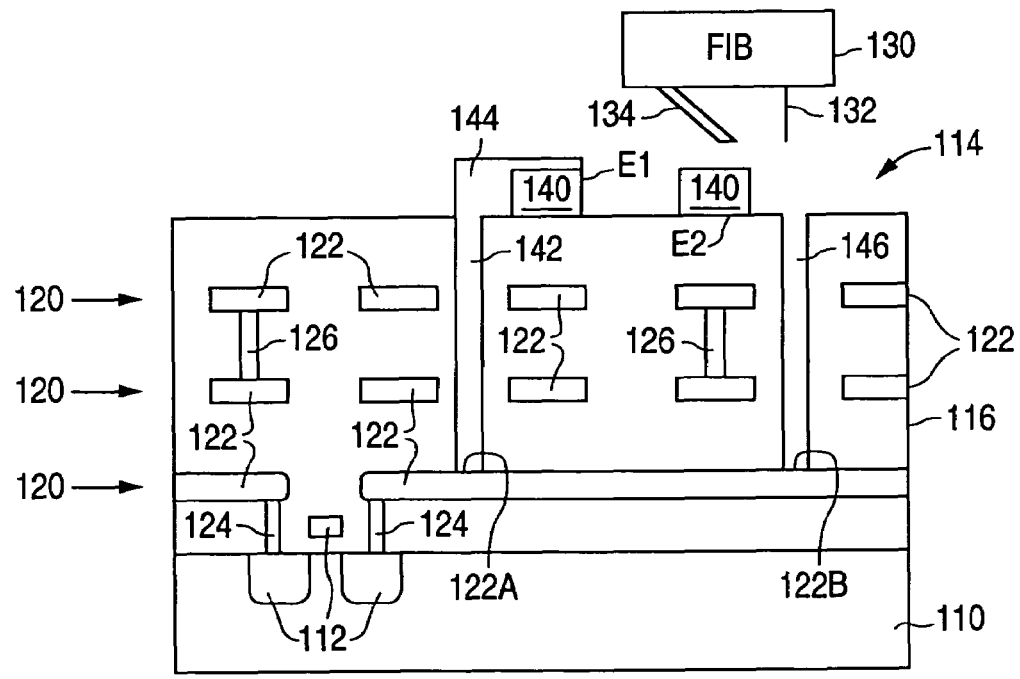

As shown in FIG. 1D, following the formation of metal region 144, the method next mills a second opening 146 through dielectric structure 116 to expose a second region 122B on a metal trace 122 using FIB system 130. (Although regions 122A and 122B are shown lying on the same level, regions 122A and 122B can lie on different levels.)

Figure 1E:
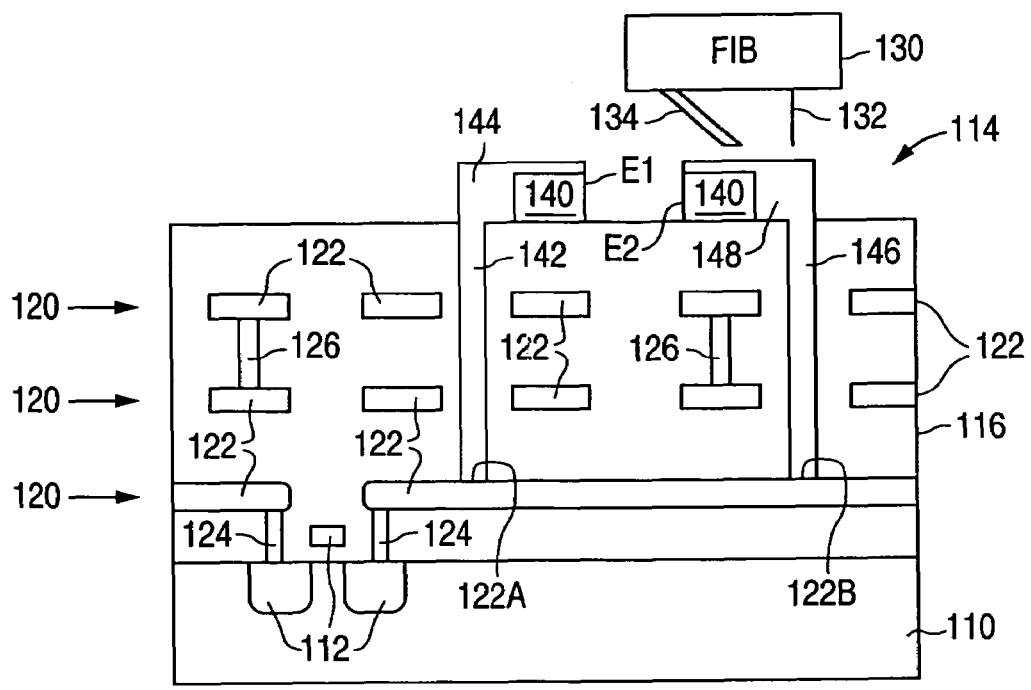

After this, as shown in FIG. 1E, the method forms a second metal region 148 that fills up opening 146 using FIB system 130. In addition, once opening 146 has been filled, the method continues by extending second metal region 148 from opening 146 to end E2 of semiconductor region 140 using FIB system 130. As a result, metal region 148 makes an electrical connection between region 122B and end E2. (Additional metal traces can be connected to an end E of semiconductor region 140 by repeating the milling and metal deposition steps.)

Figure 1F:
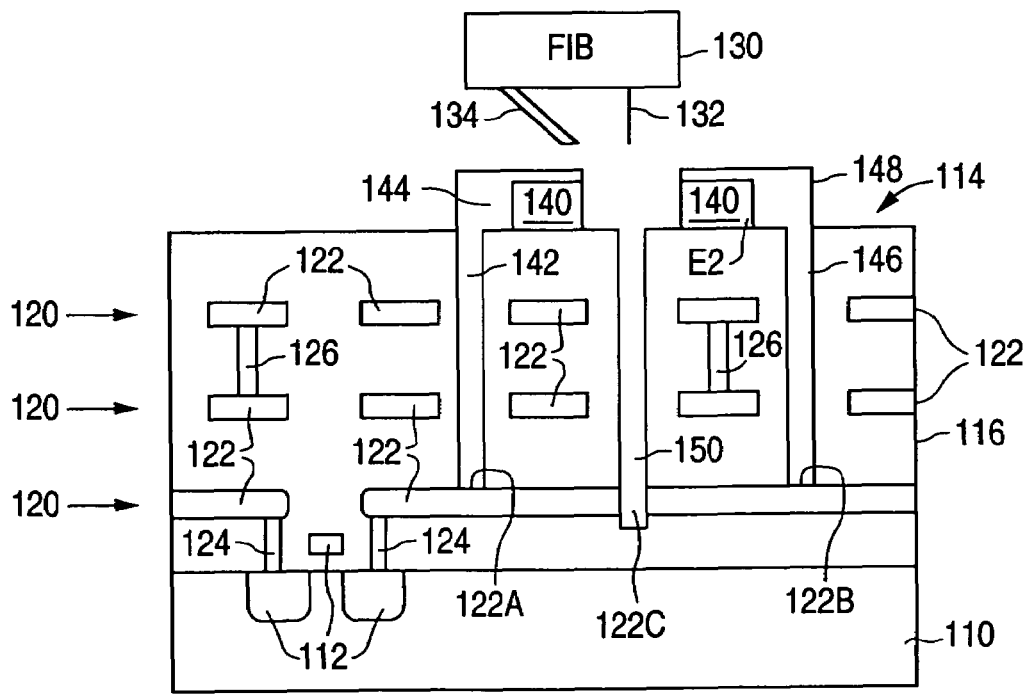

As shown in FIG. 1F, the method of the present invention can optionally continue by milling a third opening 150 through dielectric structure 116, and then through a region 122C of a metal trace 122 to sever the metal trace at that point using FIB system 130. Severing the metal trace 122 allows a resistance to be added in series, while resistance can be added in parallel without severing a metal trace.

Figure 1G:
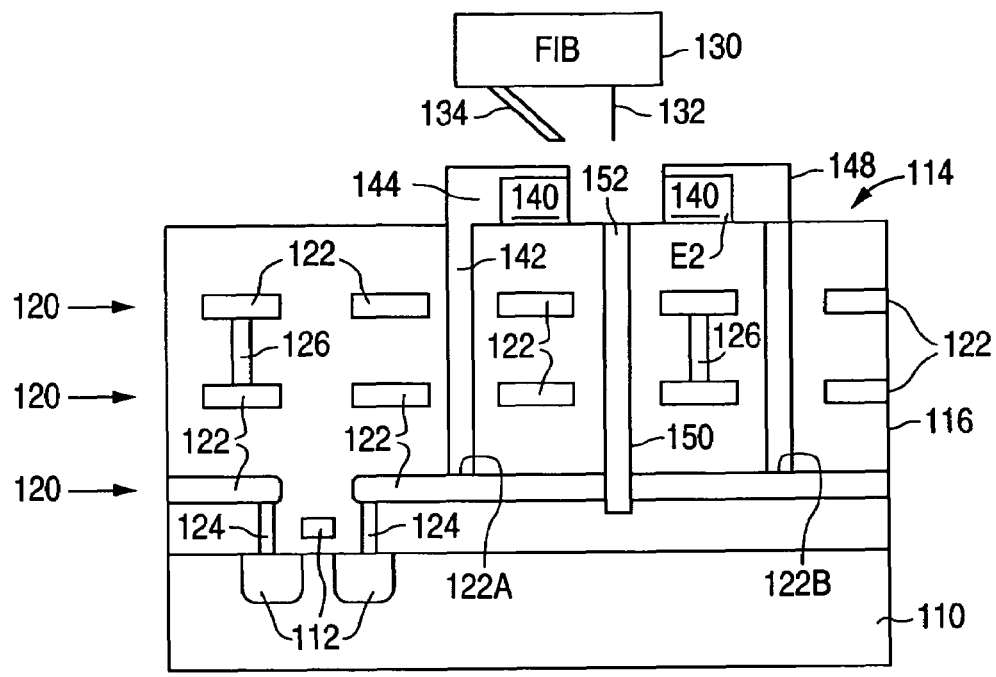

After this, as shown in FIG. 1G, the method forms an isolation region 152 that fills up opening 150 to isolate the severed ends of the metal trace. The processes of forming isolation regions with a FIB system utilizing a gas that deposits an isolation material when the gas interacts with the focused ion beam are well known in the art.

Thus, the present invention provides a method of editing a semiconductor die by adding a resistance to exact points within the embedded circuits of the integrated circuit. The added resistance can be used when debugging a new circuit, for example, to improve device matching or add delay to a signal line.

When an integrated circuit in a prototype die is not working completely as expected, the present invention provides the designer of the integrated circuit with the opportunity to add a range of resistance values, which are substantially larger than metal, between virtually any number of points on the integrated circuit. The range of resistance values encompasses the expected, simulated, or estimated fix values that the integrated circuit designer has selected.

Once the selected resistance has been added, the integrated circuit can be retested to determine if the integrated circuit is working as expected. If the added resistance does not improve performance, another solution can be tried. If the added resistance improves performance, but not by enough, the process can be repeated using a larger resistance. As a result, the present invention allows fast on-the-fly performance tweaking experimentation.

Thus, the present invention allows design fixes to be implemented and tested without incurring the delay in time and the significant expense that are required to first obtain new photolithographic mask set revisions, and then fabricate new parts that include the added resistance.

Figure 2A:
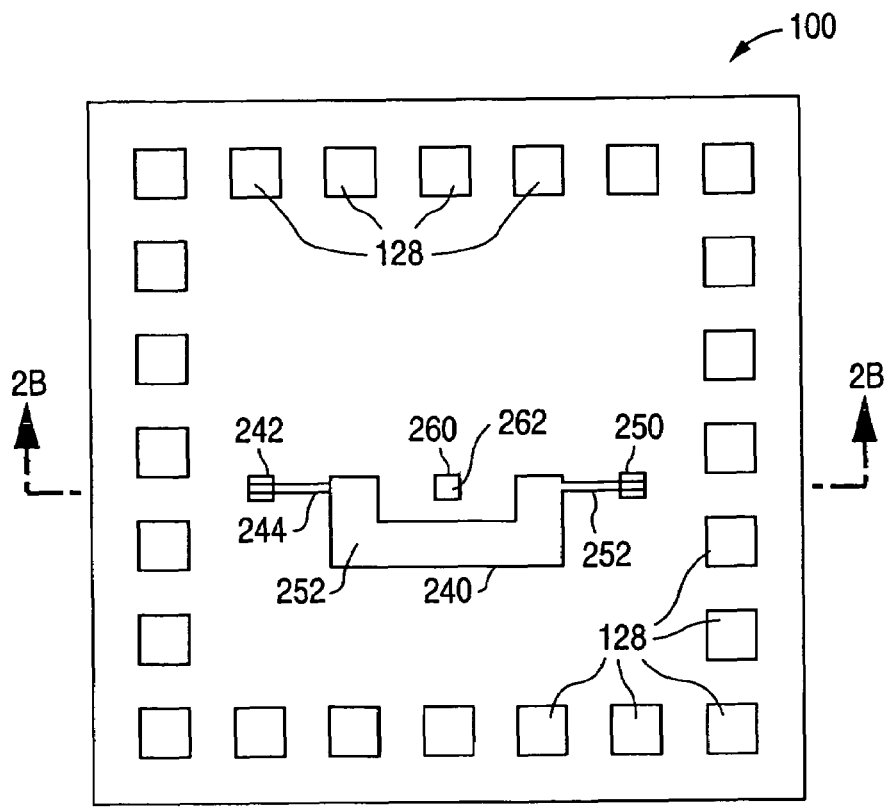
FIGS. 2A-2G are views illustrating an example of a method of editing semiconductor die 100 in accordance with an alternate embodiment of the present invention.
Figure 2B:
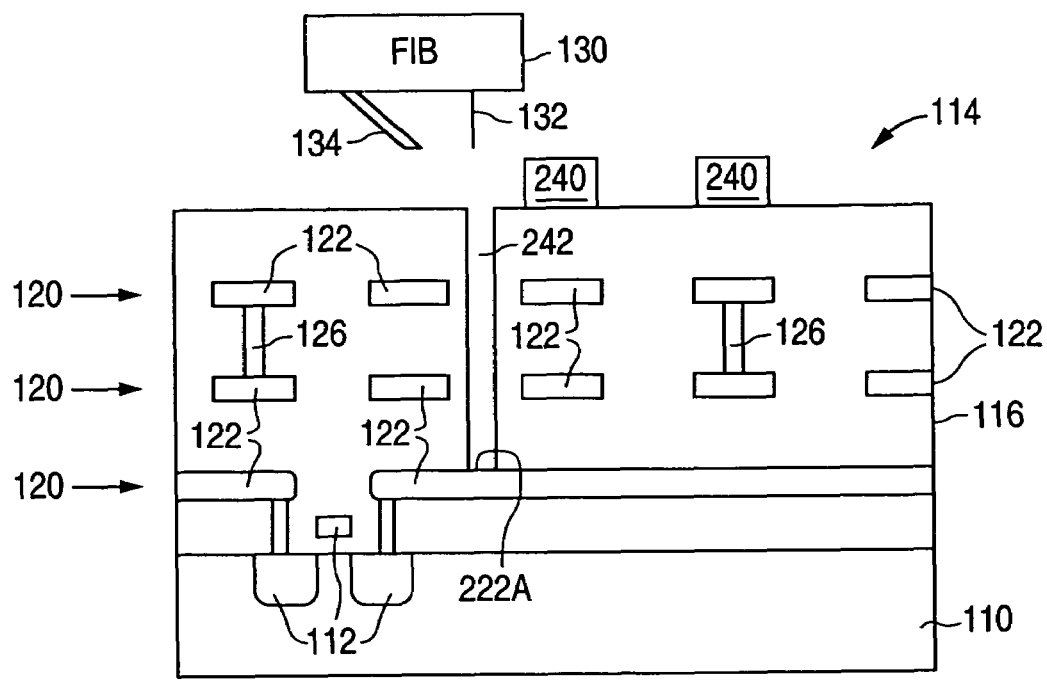

FIGS. 2A-2G show views that illustrate an example of a method of editing semiconductor die 100 in accordance with an alternate embodiment of the present invention. FIG. 2A shows a plan view of die 100, while FIGS. 2B-2G show cross-sectional views taken along line 2B-2B of FIG. 2A. As shown in FIGS. 2A and 2B, the method begins by forming a conductive semiconductor region 240 on the top surface of interconnect structure 114 after die 100 has been formed.

In the present example, semiconductor region 240 can represent, for example, the bottom plate of a capacitor. Semiconductor region 240 can have any shape, and is shown with a square U-shape for purposes of illustration only (so that three openings can be seen in the same cut plane). The geometry of semiconductor region 240, along with the dopant concentration level (e.g., p−, n−, n, or n+) of region 240, can be adjusted to meet a range of customized capacitance values. In addition, region 240 can be formed in the same manner as semiconductor region 140.

Once semiconductor region 240 has been formed on the top surface of dielectric structure 116, the method mills a first opening 242 through dielectric structure 116 to expose a first region 222A on a metal trace 122 using FIB system 130. First region 222A can be deeply embedded in the circuit architecture, such as on the metal-1 level.

Figure 2C:
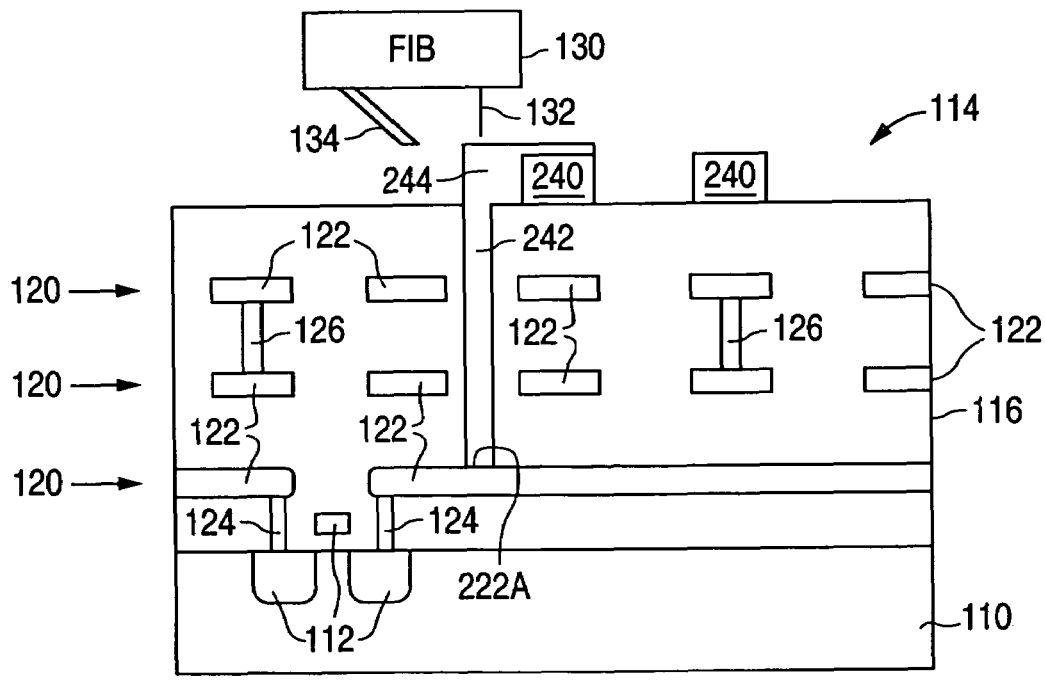

As shown in FIG. 2C, after first opening 242 has been formed, the method forms a first metal region 244 that fills up opening 242 and extends from opening 242 to semiconductor region 240 using FIB system 130. As a result, metal region 244 makes an electrical connection between region 222A and semiconductor region 240.

Figure 2D:
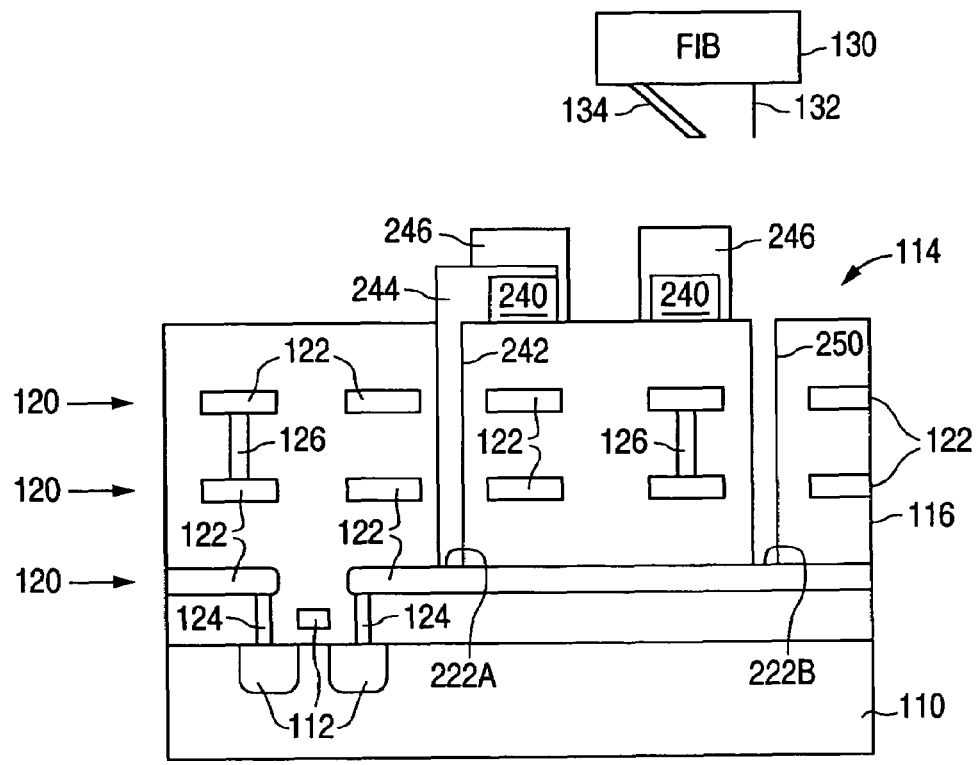

Next, as shown in FIG. 2D, an insulation layer 246 is formed over semiconductor region 240, including at least a portion of a side wall of semiconductor region 240, using FIB system 130. (Insulation layer 246 can alternately be formed on semiconductor region 240 prior to the formation and filling of opening 242 as long as an electrical connection can be made to region 240.) As noted above, the processes of forming isolation with a FIB system utilizing a gas that deposits an isolation material when the gas interacts with the focused ion beam are well known in the art.

Following the formation of insulation layer 246, the method mills a second opening 250 through dielectric structure 116 to expose a second region 222B on a metal trace 122 using FIB system 130. (Second region 222B can be at the same or a different layer as first region 222A.)

Figure 2E:
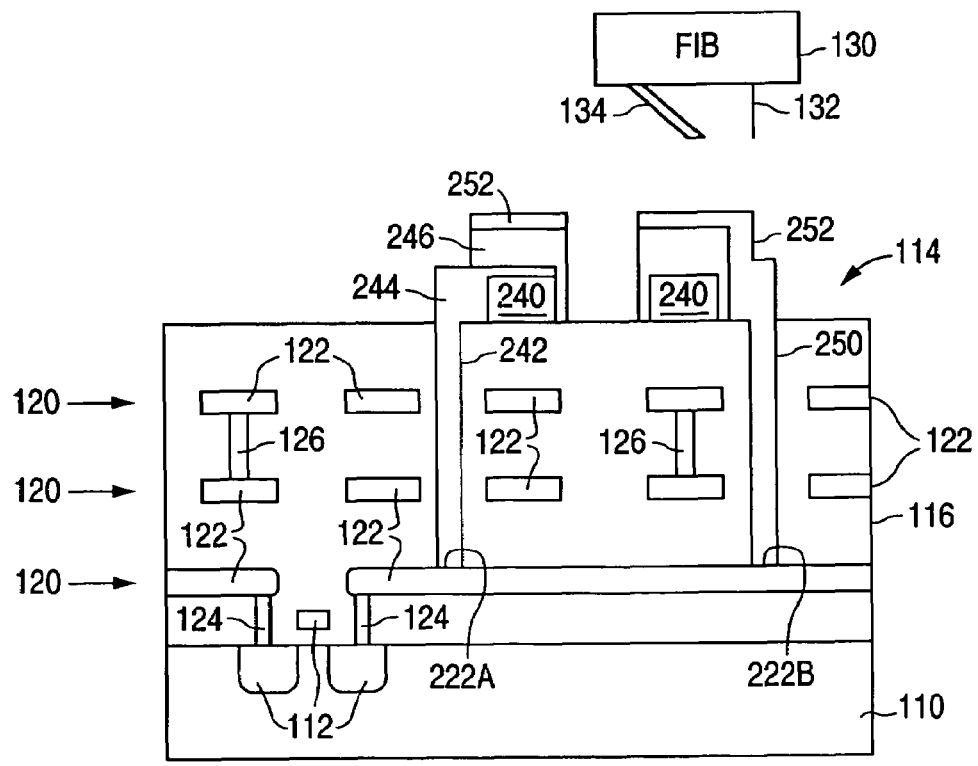

After this, as shown in FIG. 2E, the method forms a second metal region 252 that fills up opening 250 and extends from opening 250 to the top surface of insulation layer 246 that overlies semiconductor region 240 using FIB system 130. As further shown in FIG. 2A, the top surface of insulation layer 246 is also covered with second metal region 252 to form the top plate of the capacitor. (Additional metal traces can be connected to semiconductor region 240 or metal region 252 by repeating the milling and metal deposition steps.)

Figure 2F:
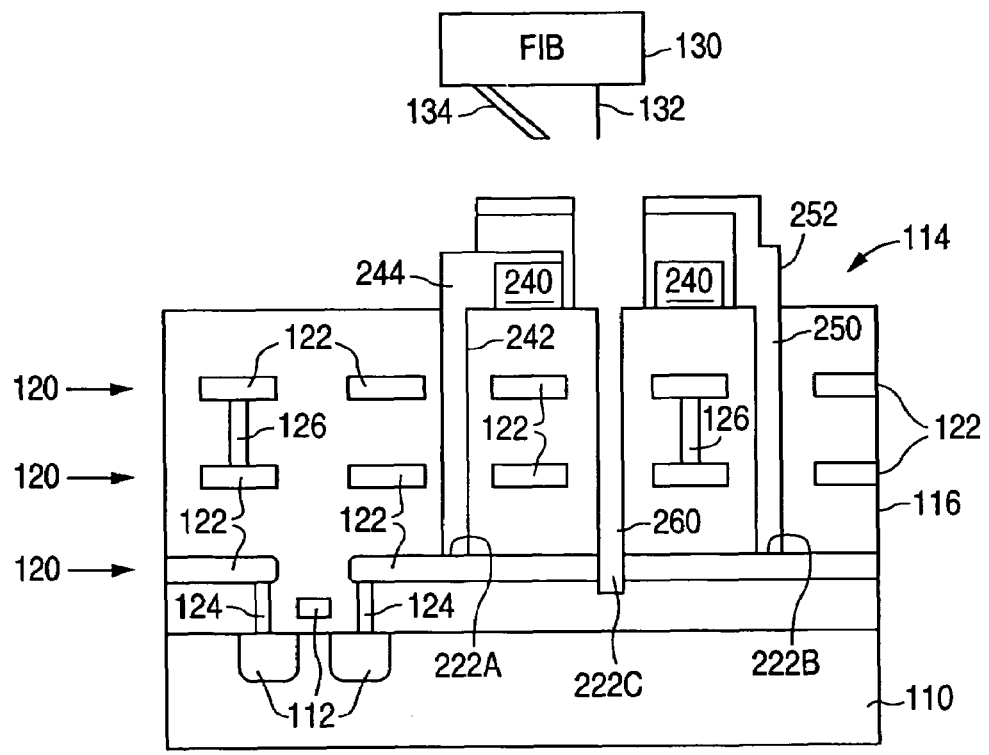
Figure 2G:
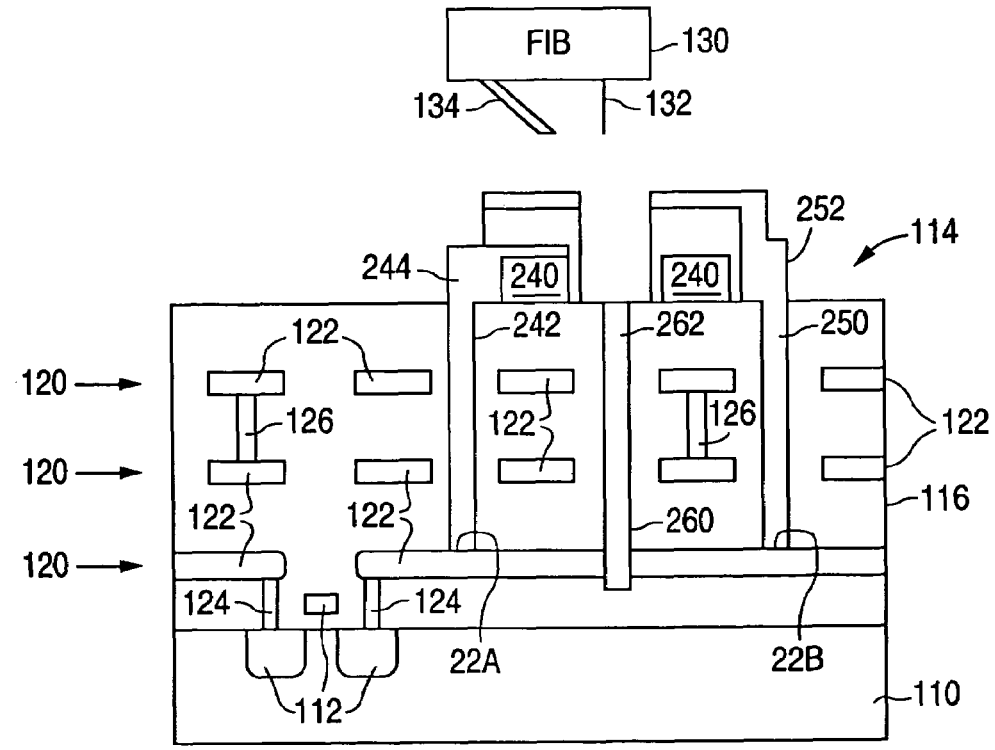

As shown in FIG. 2F, the method of the present invention can optionally continue by milling a third opening 260 through dielectric structure 116, and then through a region 222C of a metal trace 122 to sever the metal trace at that point using FIB system 130. Severing the metal trace 122 allows a capacitance to be added in series, while capacitance can be added in parallel without severing a metal trace. After this, as shown in FIG. 2G, the method forms an isolation region 262 in opening 260 that isolates the severed ends of metal trace 122.

Thus, the present invention provides a method of editing a semiconductor die by adding a capacitance to exact points within the embedded circuits of the integrated circuit. The added capacitance can be used when debugging a new circuit. As a result, the present invention provides the designer of the integrated circuit with the opportunity to add a range of capacitance values between virtually any number of points on the integrated circuit. The range of capacitance values, which can be varied by the size of the top and bottom plates as well as the thickness of the dielectric, encompasses the expected, simulated, or estimated fix values that the integrated circuit designer has selected.

As above, once the selected capacitance has been added, the integrated circuit can be retested to determine if the integrated circuit is working as expected. If the added capacitance does not improve performance, another solution can be tried. If the added capacitance improves performance, but not by enough, the process can be repeated using a larger or smaller capacitance. As a result, the present invention allows fast on-the-fly capacitance tweaking as well.

Thus, the present invention allows design fixes using resistors and capacitors to be implemented and tested without incurring the delay in time and the significant expense that are required to obtain new photolithographic mask set revisions, and then fabricate new dice that include the added resistance and capacitance.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of editing a semiconductor die, the semiconductor die having:
   a semiconductor structure that includes a substrate and a plurality of devices that are formed in and on the substrate; and
   an interconnect structure connected to the semiconductor structure to electrically interconnect the devices to realize a circuit, the interconnect structure having a top surface, a number of metal traces, and a non-conductive structure that contacts the semiconductor structure and each metal trace, the number of metal traces including a first metal trace and a second metal trace,
   the method comprising:
   attaching an external structure to the top surface of the interconnect structure of the die, the external structure including silicon;
   forming a first opening in the non-conductive structure to expose a first metal region on a metal trace that lies between the first metal trace and the semiconductor structure; and
   forming a first conductor, the first conductor contacting the external structure and lying in the first opening to contact the first metal region.

2. The method of claim 1 and further comprising:
   forming a second opening in the non-conductive structure to expose a second metal region on a metal trace; and
   forming a second conductor, the second conductor contacting the external structure and lying in the second opening to contact the second metal region.

3. The method of claim 2 and further comprising forming a third opening, the third opening extending from the top surface of the interconnect structure down towards the semiconductor structure to sever a metal trace that lies between the first metal trace and the semiconductor structure.

4. The method of claim 2 wherein the first metal region and the second metal region are spaced apart regions on the second metal trace.

5. The method of claim 4 and further comprising forming a third opening, the third opening extending from the top surface of the interconnect structure down through the non-conductive structure and a portion of the second metal trace to sever an electrical connection between the first and second metal regions.

6. A method of editing a semiconductor die, the semiconductor die having:
   a semiconductor structure that includes a substrate and a plurality of devices that are formed in and on the substrate; and
   an interconnect structure connected to the semiconductor structure to electrically interconnect the devices to realize a circuit, the interconnect structure having a top surface, a number of metal traces, and a non-conductive structure that contacts the semiconductor structure and each metal trace, the number of metal traces including a first metal trace and a second metal trace,
   the method comprising:
   attaching an external structure to the top surface of the interconnect structure of the die, the external structure including a concentration of dopant atoms;
   forming a first opening in the non-conductive structure to expose a first metal region on a metal trace that lies between the first metal trace and the semiconductor structure; and
   forming a first conductor, the first conductor contacting the external structure and lying in the first opening to contact the first metal region.

7. The method of claim 6 and further comprising:
   forming a second opening in the non-conductive structure to expose a second metal region on a metal trace; and
   forming a second conductor, the second conductor contacting the external structure and lying in the second opening to contact the second metal region.

8. The method of claim 7 and further comprising forming a third opening, the third opening extending from the top surface of the interconnect structure down towards the semiconductor structure to sever a metal trace that lies between the first metal trace and the semiconductor structure.

9. The method of claim 7 wherein the first metal region and the second metal region are spaced apart regions on the second metal trace.

10. The method of claim 9 and further comprising forming a third opening, the third opening extending from the top surface of the interconnect structure down through the non-conductive structure and a portion of the second metal trace to sever an electrical connection between the first and second metal regions.

11. A method of editing a semiconductor die, the semiconductor die having:
    a semiconductor structure that includes a substrate and a plurality of devices that are formed in and on the substrate; and
    an interconnect structure connected to the semiconductor structure to electrically interconnect the devices to realize a circuit, the interconnect structure having a top surface, a number of metal traces, and a non-conductive structure that contacts the semiconductor structure and each metal trace, the number of metal traces including a first metal trace and a second metal trace,
    the method comprising:
    attaching an external structure to the top surface of the interconnect structure of the die;
    forming a first opening in the non-conductive structure to expose a first metal region on a metal trace that lies between the first metal trace and the semiconductor structure;
    forming a first conductor, the first conductor contacting the external structure and lying in the first opening to contact the first metal region;

forming a dielectric region that is connected to the external structure and the first conductor;

forming a second opening in the non-conductive structure to expose a second metal region on a metal trace; and forming a second conductor, the second conductor contacting the dielectric region, lying over the external structure, and lying in the second opening to contact the second metal region, the second conductor being electrically isolated from the external structure.

12. The method of claim 11 and further comprising forming a third opening, the third opening extending from the top surface of the interconnect structure down towards the semiconductor structure to sever a metal trace that lies between the first metal trace and the semiconductor structure.

13. The method of claim 12 wherein the first metal region and the second metal region are spaced apart regions on the second metal trace.

14. The method of claim 13 and further comprising forming a third opening, the third opening extending from the top surface of the interconnect structure down through the non-conductive structure and a portion of the second metal trace to sever an electrical connection between the first and second metal regions.

15. A method of editing a semiconductor die, the semiconductor die having:

a semiconductor structure that includes a substrate and a plurality of devices that are formed in and on the substrate; and an interconnect structure connected to the semiconductor structure to electrically interconnect the devices to realize a circuit, the interconnect structure having a top surface, a number of metal traces, and a non-conductive structure that contacts the semiconductor structure and each metal trace, the method comprising:

attaching a piece of silicon to only a non-conductive region of the top surface of the interconnect structure of the die;

forming a first opening in the non-conductive structure to expose a first metal region of a metal trace; and forming a first conductor, the first conductor contacting the piece of silicon and lying in the first opening to contact the first metal region.

16. The method of claim 15 and further comprising:

forming a second opening in the non-conductive structure to expose a second metal region of a metal trace; and forming a second conductor, the second conductor contacting the piece of silicon and lying in the second opening to contact the second metal region.

17. The method of claim 15 wherein a dielectric region contacts the piece of silicon, and section of silicon contacts the dielectric region.

18. The method of claim 17 and further comprising:

forming a second opening in the non-conductive structure to expose a second metal region of a metal trace; and forming a second conductor, the second conductor contacting the section of silicon and lying in the second opening to contact the second metal region.

19. The method of claim 18 wherein the first and second metal regions are part of a same metal trace.

* * * * *